United States Patent
Morche

(10) Patent No.: US 9,130,581 B2
(45) Date of Patent: Sep. 8, 2015

(54) CONFIGURATION METHOD AND DEVICE FOR ELECTRICAL AND/OR ELECTRONIC CIRCUITS

(75) Inventor: Dominique Morche, Meylan (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 911 days.

(21) Appl. No.: 13/279,783

(22) Filed: Oct. 24, 2011

(65) Prior Publication Data

US 2012/0110832 A1 May 10, 2012

(30) Foreign Application Priority Data

Nov. 8, 2010 (FR) ...................................... 10 59204

(51) Int. Cl.
| | |
|---|---|
| *H05K 3/30* | (2006.01) |
| *H03M 1/06* | (2006.01) |
| *H03M 1/12* | (2006.01) |
| *H03M 1/66* | (2006.01) |

(52) U.S. Cl.
CPC .............. *H03M 1/0653* (2013.01); *H03M 1/12* (2013.01); *H03M 1/66* (2013.01); *Y10T 29/49004* (2015.01)

(58) Field of Classification Search
CPC ..... H03M 1/004; H03M 1/0653; H03M 1/12; H03M 1/66; Y10T 29/49004; Y10T 29/49128; Y10T 29/4913
USPC ......... 29/593, 25.01, 825, 832, 836; 327/524, 327/595; 323/243
See application file for complete search history.

(56) References Cited

U.S. PATENT DOCUMENTS

| | | | |
|---|---|---|---|
| 4,112,360 A * | 9/1978 | Bergmann | ................. 324/76.49 |
| 5,202,687 A | 4/1993 | Distinti | |

(Continued)

FOREIGN PATENT DOCUMENTS

| | | |
|---|---|---|
| WO | WO 88/05243 | 7/1988 |
| WO | WO 03/021790 A2 | 3/2003 |
| WO | WO 2005/104376 A1 | 11/2005 |

OTHER PUBLICATIONS

French Preliminary Search Report issued May 18, 2011, in Patent Application No. FR 1059204.

(Continued)

*Primary Examiner* — Peter DungBa Vo
*Assistant Examiner* — Jeffrey T Carley
(74) *Attorney, Agent, or Firm* — Oblon, McClelland, Maier & Neustadt, L.L.P.

(57) ABSTRACT

A method for configuring an electrical circuit comprising several functional blocks having characteristic quantities of the same type and the values whereof are mutually proportional, the functional blocks being built by means of at least one set of electrical elements of a similar type and means for connecting said electrical elements to one another and/or to the rest of the electrical circuit according to different connection configurations, comprising the steps consisting of:
  measuring a value of a parameter of the electrical circuit for each of a set of connection configurations tested,
  selection, from among the coupling configurations tested, of one configuration for which the value of the measured parameter corresponds to the case where the mismatch between the values of the characteristic quantities of at least one pair of functional blocks is the smallest, and
  positioning the connecting means according to the configuration selected.

9 Claims, 5 Drawing Sheets

(56) References Cited

U.S. PATENT DOCUMENTS

| | | | |
|---|---|---|---|
| 5,402,125 A | | 3/1995 | Distinti |
| 5,404,143 A | * | 4/1995 | Distinti .................. 341/158 |
| 6,118,398 A | * | 9/2000 | Fisher et al. ................ 341/144 |
| 7,301,366 B1 | | 11/2007 | Devnath et al. |
| 7,541,857 B1 | | 6/2009 | Wong et al. |
| 2003/0218477 A1 | | 11/2003 | Jang et al. |
| 2007/0120725 A1 | | 5/2007 | Huang |
| 2007/0222653 A1 | | 9/2007 | Briaire |
| 2009/0243663 A1 | | 10/2009 | Chalamala et al. |

OTHER PUBLICATIONS

Imran Ahmed, et al., "An 11-Bit 45 MS/s Pipelined ADC With Rapid Calibration of DAC Errors in a Multibit Pipeline Stage", IEEE Journal of Solid-State Circuits, vol. 43, No. 7, XP 011229231, Jul. 2008, pp. 1626-1637.

Marcel J. M. Pelgrom, et al., "Matching Properties of MOS Transistors", IEEE Journal of Solid-State Circuits, vol. 24, No. 5, Oct. 1989, pp. 1433-1440.

Gert Cauwenberghs, et al., "Adaptive Digital Correction of Analog Errors in MASH ADC's—Part I: Off-Line and Blind On-Line Calibration", IEEE Transactions on Circuits and Systems—II: Analog and Digital Signal Processing, vol. 47, No. 7, Jul. 2000, pp. 621-628.

Henrik T. Jensen, et al., "A Performance Analysis of the Partial Randomization Dynamic Element Matching DAC Architecture", IEEE International Symposium on Circuits and Systems, Jun. 9-12, 1997, pp. 9-12.

R. K. Henderson, et al., Dynamic Element Matching Techniques With Arbitrary Noise Shaping Function, IEEE International Symposium on Circuits and Systems, ISCAS, vol. 1, May 12-15, 1996, pp. 293-296.

Brian P. Ginsburg, et al., "Highly Interleaved 5b 250MS/s ADC with Redundant Channels in 65nm CMOS", IEEE International Solid-State Circuits Conference, Session 12, Feb. 5, 2008, pp. 240-241.

Jipeng Li, et al., "Background Calibration Techniques for Multistage Pipelined ADCs With Digital Redundancy", IEEE Transactions on Circuits and Systems—II: Analog and Digital Signal Processing, vol. 50, No. 9, Sep. 2003, pp. 531-538.

Benoit Provost, et al., "A Practical Self-Calibration Scheme Implementation for Pipeline ADC", IEEE Transactions on Instrumentation and Measurement, vol. 53, No. 2, Apr. 2004, pp. 448-456.

* cited by examiner

CONFIGURATION METHOD AND DEVICE FOR ELECTRICAL AND/OR ELECTRONIC CIRCUITS

TECHNICAL FIELD

The invention relates to the field of configuration, of optimization and of making of electrical and/or electronic circuits in all types of technologies: silicon (MOS, BiCMOS, SOI, . . . ), GaAs or even composed of carbon nanotubes. Likewise, the invention is not limited to circuits operating in a particular range of frequencies or built according to a particular design, and relates for example to the manufacture of radio-frequency, analog or even mixed analog-digital circuits.

The invention also relates to the configuration, the optimization and the making of circuits using electrical and/or electronic components (resistors, capacitors, inductors, transistors, . . . ) or to sub-circuits including such components, which can have an arbitrary dispersion of the value of one or more of their electrical characteristics.

The invention also applies to the manufacture of circuits from electrical and/or electronic elements the performance whereof is degraded when the difference between the true values of their electrical characteristics is great.

The invention can be advantageously implemented for the configuration, the optimization and making of analog-to-digital or digital-to-analog converters, of comparators, of switched-capacitor filters, of long-tailed pairs or any other electrical and/or electronic circuit.

PRIOR STATE OF THE ART

Two electrical and/or electronic components, resistors for example, with identical nominal values, actually have values which are not quite identical. For example, in the case of two electrical resistors with identical nominal values equal to R ohms, these two resistors each have in reality a value equal to R ohms+/−a few % of the value of R ohms, this percentage varying from one electrical resistor to another.

This dispersion about the nominal value of the component is due to component manufacturing tolerances. Thus, when it is desired to use, in an electrical and/or electronic circuit, two (or more) electrical and/or electronic components with identical values or having a specific ratio of values, there is therefore a very good chance that these values are subject to a difference, called a "mismatch," the value of which is random, due to the uncertainties of component manufacture.

There exist several techniques for reducing the influence of this random dispersion on the values of the electrical characteristics of the components.

The simplest solution for reducing this random dispersion consists of increasing the size of the components used in order to improve the accuracy of the real values of the electrical characteristics of these components. For example, it is known that the accuracy of components manufactured in silicon technology is proportional to the surface area of these components.

This solution, though effective, has however the drawback of increasing the surface area of the circuit (and hence its manufacturing cost) but also its power consumption, a greater electrical current being necessary, for example, for charging a capacitor of larger size.

It is also known, in the case of analog-to-digital or sigma-delta coding converters, to reduce the influence of the dispersion around the values of the electrical capacitances of these converters by analog or digital compensation of the signal obtained at the converter's output.

For this purpose, a measurement of the performance of the converter is carried out based on signals, known or not, applied to the input of the converter, or based on intermediate test signals. Then, based on the measurements made at the output of the converter or in the converter, an estimate is deduced of the values of the components used and the value obtained at the converter output is corrected using a circuit, digital for example. The refinement of the estimated value can be performed iteratively or not.

This compensation technique, however, has a number of drawbacks. Indeed, the calculation of the estimate of the values of each of the components is generally complicated and involves an increase of the required surface area and of the power consumption. In addition, given that these circuits generally have other imperfections (nonlinearities, offset, parasitic charge insertions, . . . ), the estimate of the dispersions is often subject to error and therefore limited in accuracy.

The gain in resolution obtained is therefore limited. Finally, the errors generated by the dispersions can sometimes have consequences for the converter output signal which are irreversible, such as saturation of the signal for example, and which are thus impossible to correct at the converter output by a compensation subsequent to the conversion of the signal by the converter.

In certain systems such as analog-to-digital or digital-to-analog converters, it is possible to reduce the influence of the inaccuracy in the values of the components by causing the error generated by this inaccuracy to vary over time randomly or in deterministic fashion.

This variation in the error is used generally when the number of identical components used is high. The principle of this solution is to select, at every moment, randomly or deterministically, a certain number of components necessary for the circuit from among a greater number of available components.

There too, this technique, called mixing, has drawbacks. First of all, it is applicable only to a limited number of circuits, to with circuits having not only a large number of components but also wherein the variation of the generated error makes it possible to reduce their impact. For example, this mixing technique cannot always be used in a digital-to-analog converter operating at the Nyquist frequency (the entire bandwidth whereof is used in the application) because this random mixing transforms nonlinearity into noise, which is not acceptable because noise conditioning can only be used if an oversampling factor is available, which is not always the case in such a circuit.

DESCRIPTION OF THE INVENTION

Thus there is a need to propose a method and a device for configuring electrical and/or electronic circuits which allows a reduction of the influence of the dispersion about the values of the characteristics of electrical and/or electronic components manufactured with elements of said electrical and/or electronic circuits.

Moreover, there is a need to improve the reliability of the circuit with respect to the accuracy of the values of the electrical and/or electronic components used, and/or to reduce the impact of the random dispersion of the nominal values of the electrical and/or electronic components on the electrical characteristics of the electrical and/or electronic circuit being designed.

For this purpose, one embodiment proposes a method for configuring an electrical circuit comprising several functional blocks having characteristic quantities, or values, of the same type and the values whereof are mutually proportional, the functional blocks being manufactured by means of at least one set of electrical elements of the same type and/or of the same nominal theoretical value, and means of connecting said electrical elements to one another and/or to the rest of the electrical circuit according to different connection configurations, comprising at least the steps consisting of:

measuring a value of at least one parameter of the electrical circuit for each of a set of connection configurations tested, selecting, among the tested connection configurations, a configuration for which the value of the parameter measured corresponds to the case where the mismatch between the values of the characteristic quantities of at least one pair of functional blocks is the smallest, and positioning connecting means according to the configuration selected.

In the different connection configurations, at least part of the electrical elements are distributed differently between at least two functional blocks. These electrical elements can therefore pass from one functional block to another according to the connection configuration.

For the sake of clarity, the term "electrical" will be used in the remainder of the document to designate the expression "electrical and/or electronic." What is more, even though the term "electronic" is used, the invention also relates to the configuration of microelectronic and/or nanoelectronic circuits based on microelectronic and/or nanoelectronic elements and/or components.

It therefore makes it possible, based on a set of electrical elements with the same theoretical nominal value, possibly showing dispersions about the values of their electrical characteristics, to improve the performance of the electrical circuit including functional blocks obtained by judiciously combining these electrical elements, and to select the configuration of electrical elements making it possible to obtain the circuit having the best possible performance and corresponding to the case where the mismatch between the values of the characteristic quantities of at least one pair of functional blocks is the smallest.

Another embodiment can consist of combining, for example using switches, several electrical elements to obtain several functional blocks, corresponding for example to equivalent electrical components, having electrical characteristics, or characteristic quantities, with real values closer to one another than if each of these blocks had been obtained from a single element manufactured with the same manufacturing tolerance as the electrical elements used to make the equivalent components. It therefore makes it possible, by judiciously combining the electrical elements, to also combine their tolerances, which makes it possible, by choosing the best configuration, to optimally compensate and balance the tolerances of the electrical elements and thus reduced the difference, or "mismatch," between two components which it is desired to assemble with nominal values as close as possible.

Thus, during the design of the circuit, several possible combinations of electrical elements which can pass from one functional block to another are compared, corresponding to the different connection configurations of the electrical elements, while evaluating the performance of the complete system obtained based on these elements, for example by measuring the difference between the characteristic quantities of the functional blocks constituted by combining the electrical elements. The best solution found is then retained, that is the combination of electrical elements constituting functional blocks, the characteristic quantities whereof are closest to one another or to a desired proportionality ratio.

It is also possible to choose, among the functional blocks of the circuit, a reference functional block and to choose the configuration wherein the other function block(s) have a characteristic quantity the value whereof is as close as possible to the real value of this reference functional block.

The embodiment may consist in particular of choosing the configuration wherein the output currents and/or voltages of the functional blocks have values that are closest to one another.

The measured parameter of the electrical circuit may be a signal-to-noise ratio, or a linearity level, or an offset level of the electrical circuit.

In one advantageous embodiment, the measured parameter of the electrical circuit may be the mismatch between the values of the characteristic quantities of said pair of functional blocks.

The electrical elements may be electrical components corresponding to resistors and/or inductors and/or capacitors and/or transistors, or electrical devices each having a plurality of electrical components, said components possibly corresponding to resistors and/or inductors and/or capacitors and/or transistors.

The electrical circuit may include at least one analog-to-digital converter and/or one digital-to-analog converter and/or one comparator and/or one amplifier and/or one switched-capacitor filter and/or one differential transistor pair.

At least part of the connection configurations may be obtained by inverting the sign of at least one input and/or output signal of at least one of the electrical elements.

The connecting means may be capable of electrically interconnecting, in series and/or in parallel, electrical elements making up one and the same functional block.

For each connection configuration, said set of electrical elements may be chosen from among a plurality of electrical elements.

Thus, the configuration process can also use the redundancy principle, thus allowing an increase in the number of configurations and hence, potentially, further reducing the difference between the values of the characteristic quantities of the functional blocks that it is desired to assemble.

The measurement of the electrical circuit may be carried out by applying a known input signal to the functional blocks constituted for each of the configurations and by measuring at least one output characteristic of said functional blocks. It is also possible to not calculate directly the values of the characteristic quantities, but to check that they are well matched.

Another embodiment relates to a method for manufacturing an electrical circuit comprising at least the steps consisting of:

manufacturing a set of electrical elements of a similar type and of means of connecting said electrical elements to one another and/or to the rest of the electrical circuits according to different connection configurations, implementing a method for configuring the electrical circuit as previously described.

Another embodiment also relates to a device for configuring an electrical circuit comprising at least:

one set of electrical elements of similar type and/or with the same theoretical nominal value.

means of connecting said electrical elements to one another and/or to the rest of the circuit according to different connection configurations constituting several functional blocks having characteristic quantities of the same type, the values whereof are mutually proportional, and wherein at least part of the electrical elements are differently distributed between at least two functional blocks, means for measuring a value of at least one parameter of the electrical circuit for each of a set of connection configurations tested, means of selecting, among the connection configurations tested, a configuration wherein the measured value of the parameter corresponds to the case where the mismatch between the values of the characteristic quantities of at least one pair of functional blocks is the smallest, means of positioning the connecting means according to the configuration selected.

The device may also comprise means of inverting the sign of at least one input and/or output signal of at least one of the electrical elements.

The connection means may include switches capable of electrically interconnecting, in series and/or in parallel, the electrical elements making up one and the same functional block.

The device may include a plurality of electrical elements from among which a set of electrical elements is selected for each coupling configuration.

The device may also include means of applying a known input signal to the functional blocks constituted for each of the configurations and means of measuring at least one output characteristic of said functional blocks.

The device may also include means of controlling the connecting means.

BRIEF DESCRIPTION OF DRAWINGS

The present invention will be better understood upon reading the description of the embodiments given by way of indicative example and without any limitation, with reference to the appended drawing in which.

Identical, similar or equivalent parts of the different figures described hereafter bear the same reference number so as to facilitate transition from one figure to another.

The different parts shown in the figures are not necessarily to a uniform scale, to make the figures more readable.

The different possibilities (variations and embodiments) must be understood as not being mutually exclusive and can be combined with one another.

DETAILED DESCRIPTION OF PARTICULAR EMBODIMENTS

Figure 1:
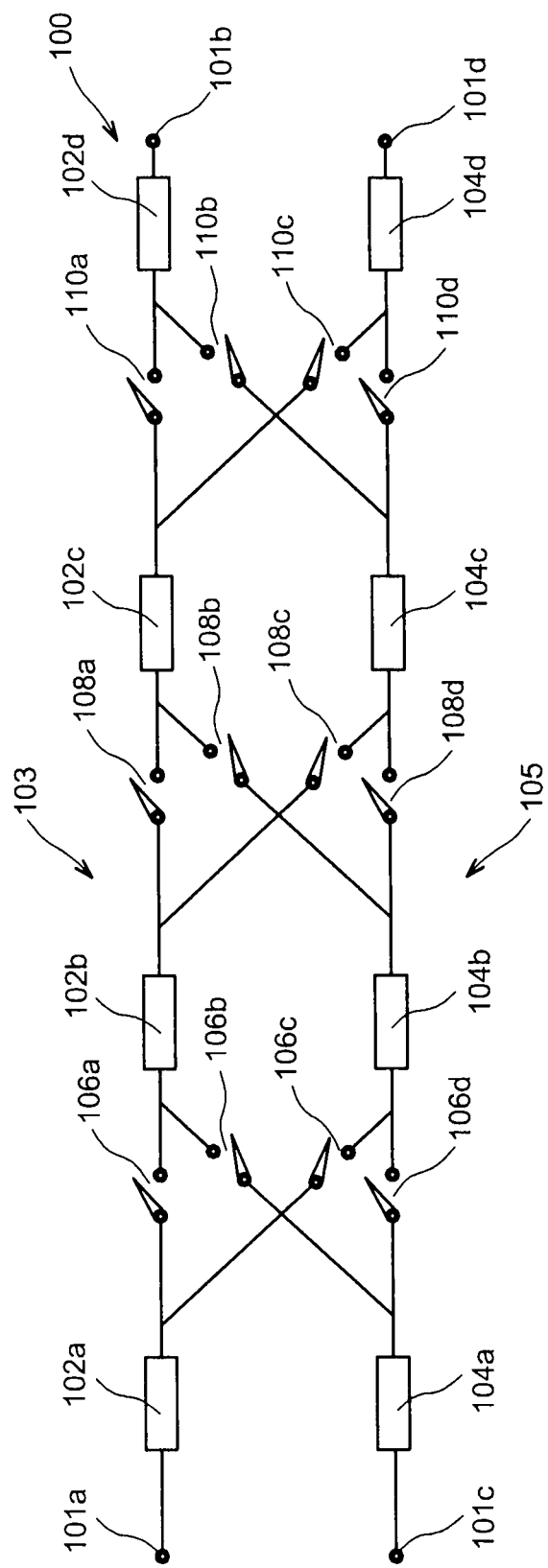
FIGS. 1 through 6 show examples of electrical circuits from which a circuit configuration method is implemented according to several particular embodiments.

Reference is first made to FIG. 1 which shows an example of an electrical circuit 100 from which a method for configuring this circuit is implemented according to a particular embodiment.

With the electrical circuit 100, it is desired to make a circuit including a first electrical resistance 103 between the terminals 101a and 101b, and a second electrical resistance 105 between the terminals 101c and 101d. These first and second electrical resistances 103, 105, each constituting a functional block the characteristic quantity whereof corresponds to the value of the electrical resistance obtained, will be built based on four electrical resistors 102a-102d arranged between the terminals 101a and 101b, and four electrical resistors 104a-104d arranged between the terminals 101c and 101d.

Whereas the resistors 102a, 102d, 104a and 104d each include one end directly connected to the terminals 101a through 101d respectively, the resistors 102a and 102d will necessarily be part of the resistance constituted between the terminals 101a and 101b and the resistors 104a and 104d will necessarily be part of the resistance constituted between the terminals 101c and 101d.

The electrical circuit 100 also includes connecting means allowing the resistors 102a-102d and 104a-104d to be connected in different ways, that is according to different configurations.

These connecting means consist in particular of four switches 106a-106d allowing the resistors 102a and 104a to be connected in different ways with the resistors 102b and 104b.

These connecting means also include four other switches 108a-108d allowing the resistors 102b and 104b to be connected with the resistors 102c and 104c according to different configurations. Finally, the connecting means also include four other switches 110a-110d allowing the resistors 102c and 104c to be connected with the resistors 102d and 104d according to different configurations.

The table below gives the two resistors that are connected together in series as a function of the switch that is closed.

| Closed switch | Connected resistors |
| --- | --- |
| 106a | 102a and 102b |
| 106b | 104a and 102b |
| 106c | 102a and 104b |
| 106d | 104a and 104b |
| 108a | 102b and 102c |
| 108b | 104b and 102c |
| 108c | 102b and 104c |
| 108d | 104b and 104c |
| 110a | 102c and 102d |
| 110b | 104c and 102d |
| 110c | 102c and 104d |
| 110d | 104c and 104d |

The aim is to build, based on the electrical resistors 102a-102d and 104a-104d, each of which has the same theoretical nominal value of 500Ω, the two resistances 103 and 105, each having a theoretical value equal to 2000Ω. However, the electrical resistors have a true value that can differ by a few percent of their theoretical nominal value (dispersion due to manufacturing tolerances of the electrical resistors 102a-102d and 104a-104d).

The aim is then to build, by judiciously combining the resistors 102a-102d and 104a-104d using the connecting means of the circuit 100, the two resistances 103 and 105 such that they have true values that are as close as possible to one another.

The selection of the best possible combination, that is of the best configuration allowing resistances 103 and 105 to be obtained with the closest possible values, will be performed by evaluating the performance obtained for the different combinations, the best solution obtained being then retained by closing the appropriate switches.

In the present case, the evaluation of the performance will consist of measuring the electrical resistance shown by each of the resistances 103 and 105 for the different configurations.

If the resistors 102a-102d and 104a-104d have for example the following real values:

102a: 505Ω
102b: 501Ω

102c: 503Ω
102d: 499Ω
104a: 497Ω
104b: 495Ω
104c: 502Ω
104d: 500Ω

It is seen that the best solution consist of connecting the resistors 102a and 102d with the resistors 104b and 104c by closing the switches 106c, 108d and 110b, and connecting the resistors 104a and 104d with the resistors 102b and 102c by closing the switches 106b, 108a and 110c, thus allowing two resistances 103 and 105 to be obtained, each with a value equal to 2001Ω. Part of the electrical elements, here the resistors 102b, 102c, 104b and 104c, can therefore pass from one functional block to the other according to the configuration in which the different switches are set, that is they can be distributed differently into the two functional blocks depending on the connection configuration that is built.

The design process implemented based on the electrical circuit 100 therefore does not consist of selecting the electrical elements that individually have the real values closest to their respective theoretical nominal values, but rather of selecting and combining the components which, once they are combined, constitute a circuit including at least two functional blocks, here the resistances 103 and 105, the characteristic quantities whereof (true resistance values) are as close as possible to one another in order to reduce to a minimum the mismatch between the values of the characteristic quantities of these two functional blocks.

In the example described previously, the electrical components are therefore selected and combined so as to obtain two functional blocks the characteristic quantities whereof are as close as possible to one another.

The electrical circuit 100 does not allow all possible combinations of resistors to be made. It is seen for example that in the circuit 100, the resistors 102a and 102d necessarily are part of the first resistance 103 and that the resistors 104a and 104d are necessarily part of the second resistance 105.

Figure 2:
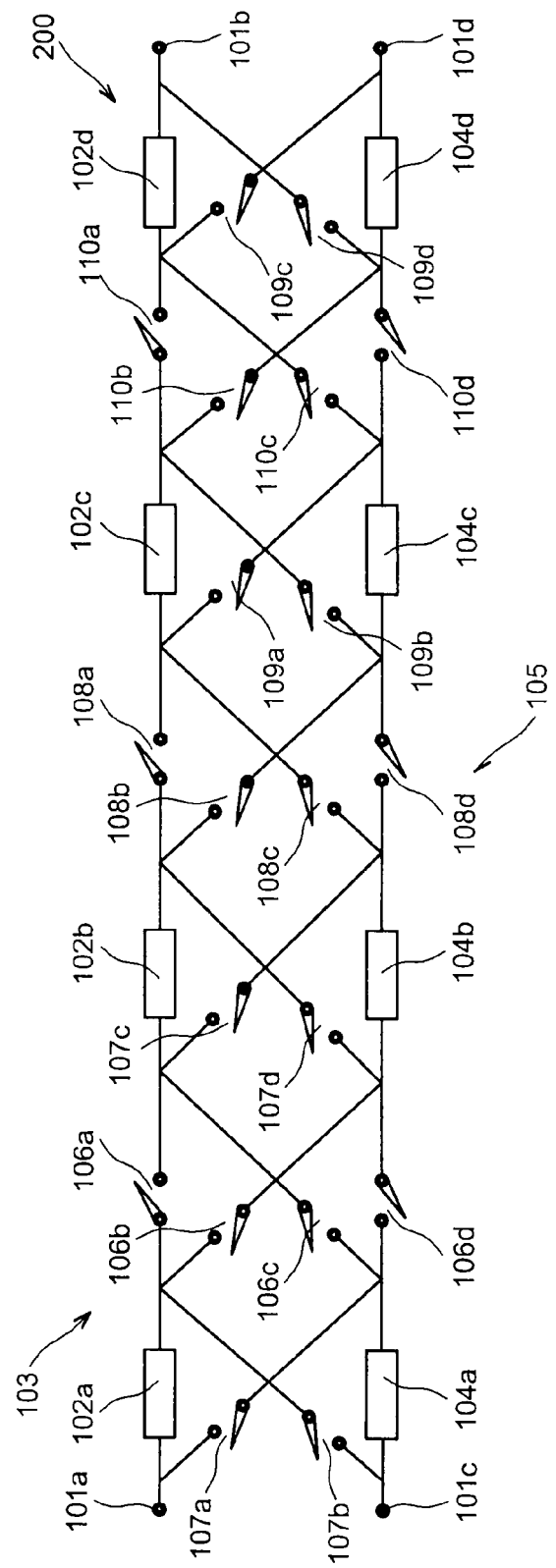

It is possible to increase the number of possible combinations by increasing the number of switches in the electrical circuit. FIG. 2 shows an electrical circuit 200 based on which it is desired, in a manner analogous to that of the circuit 100, to build a circuit including a first resistance 103 between the terminals 101a and 101b and a second electrical resistance 105 between the terminals 101c and 101d.

The circuit 200 comprises all the elements of the electrical circuit 100, that is the resistors 102a-102d and 104a-104d, as well as the switches 106a-106d, 108a-108d and 110a-110d. In addition, the electrical circuit 200 also includes additional switches 107a-107d and 109a-109d allowing all possible combinations of the resistors 102a-102d and 104a-104d to be formed. Here, all the electrical elements, that is all the resistors 102a-102d and 104a-104d, can be differently distributed between the two functional blocks, that is they can pass from one functional bloc to the other, according to the connection configuration that is built.

Hence it is seen that the circuit 200 allows, in comparison with the circuit 100, a greater number of configurations to be built, which can make it possible to obtain a better balance between the values of the resistances 103 and 105, after a greater complexity and a greater number of switches that can potentially influence the values of the resistances 103 and 105 obtained based on the circuit 200. Thus, depending on the manufacturing constraints of the circuit (frequency, surface area, ... ), a circuit will be selected for manufacture offering more or fewer possibilities, possible combinations in other words, and therefore more or fewer switches.

In the examples of the circuits 100 and 200 described previously in connection with FIGS. 1 and 2, it was seen that all the resistors 102a-102d and 104a-104d were used to constitute the two functional blocks whose characteristic quantities it is desired to balance, that is to balance the values of the resistances 103 and 105 that are formed.

In one variation, it is possible for the circuit 100 or 200 to have a greater number of electrical resistors, and that among all these electrical resistors, only part of them are combined with one another to create the resistances 103 and 105, and hence to form the best possible combination allowing the minimum mismatch between the achieved values of the resistances 103 and 105 to be obtained. Thus the circuits 100 and 200 can each include for example twelve electrical resistors, each having the same theoretical nominal value equal to 500Ω, and based on the switches of these circuits, only eight of the twelve resistors are used to form the two resistances 103 and 105 with a theoretical nominal value equal to 2000Ω each, the four remaining electrical resistors not being used to form the resistances 103 and 105. In addition, in another variation, it is possible that it is desired to balance the characteristic quantities of more than two functional blocks, that is to say that more than two resistances are formed, the values whereof are as close as possible to one another.

Figure 3:
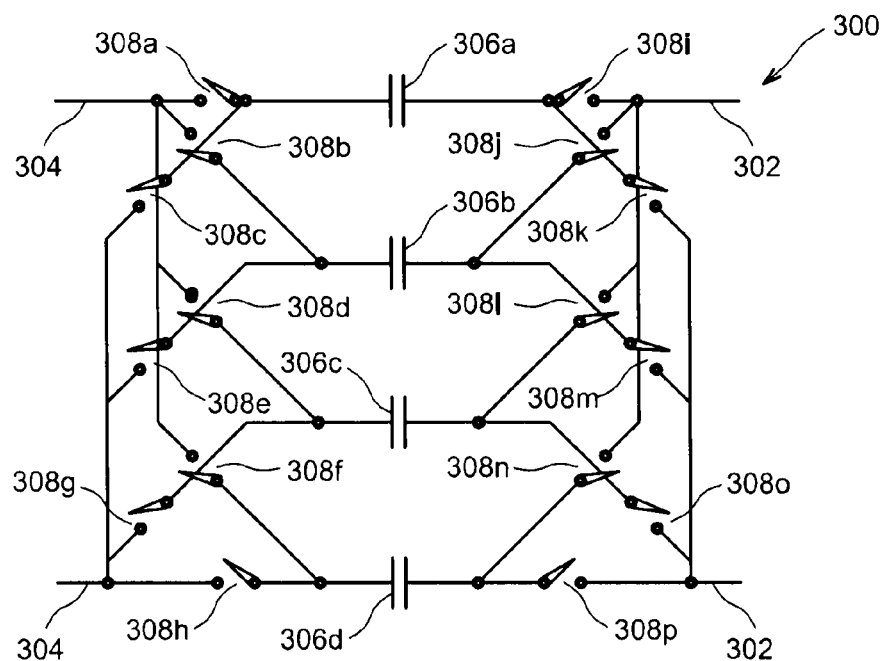

FIG. 3 shows an electrical circuit 300 based on which it is desired to electrically connect in parallel the capacitors 306a-306d between the inputs 302 and the outputs 304 to form two functional blocks, corresponding to two capacitances, the characteristic quantities whereof, corresponding to the capacitances, have values as closes as possible to one another. For this purpose, the circuit 300 includes means for connecting the four capacitors 306a-306d comprising sixteen switches 308a-308p. In the circuit 300, it is therefore desired to build two functional blocks with characteristic quantities as close as possible to one another, each block corresponding to a capacitor made up of two of the four capacitors 306a-306d connected in parallel. The capacitors 306a-306d are distributed differently between the two functional blocks depending on the connection configuration that is made. The table below shows the switches in the closed position depending on the two capacitors interconnected electrically in parallel.

| Closed switches | Connected capacitors |
|---|---|
| 308a, 308b, 308g, 308h, 308i, 308j, 308o, 308p | 306a and 306b<br>306c and 306d |
| 308a, 308d, 308e, 308h, 308i, 308l, 308m, 308p | 306a and 306c<br>306b and 306d |
| 308a, 308e, 308f, 308g, 308i, 308m, 308n, 308o | 306a and 306d<br>306b and 306c |

For each of these combinations, then, the mismatch between the true values of the capacitances thus formed is measured and the combination in which the mismatch between the values of the two capacitances is the smallest is chosen.

In analogous fashion to the variation described previously in connection with the circuits 100 and 200, it is possible for the circuit 300 to include a greater number of capacitors and that only part of these capacitors will be used to form the two capacitors that it is desired to build, the other capacitors not being connected to the rest of the circuit 300. This variation makes it possible to offer a greater number of combinations, and hence to potentially offer a better configuration.

Moreover, in the case where the circuit 300 includes a greater number of capacitors, the making of more than two functional blocks can be contemplated, the characteristic quantities whereof it will be desired to balance.

For the circuits 100, 200 and 300 described previously, it is possible for the switches to be controlled by configuration signals which, once the system is evaluated and the best combination selected, will always remain at the same value in order that the selected elements always remain electrically connected in the selected configuration.

It is also possible, however, particularly when the elements of the circuit are capacitors or dynamic elements, that the switches are used to fulfill a particular supplemental function in the circuit, for example to carry out the charging and the discharging of the capacitors in the example of the circuit 300.

It is possible for the switches in the circuit to be controlled by clock signals.

The elements of the circuits 100, 200 and 300 previously described are electrical and/or electronic components whereof the best combination is sought allowing a reduction in variability in the value of the elements obtained by their combination, that is to reduce the mismatch in the characteristic quantities of the functional blocks obtained.

It is also possible to apply this principle to a circuit whereof the elements to be combined are not electrical components but blocks or sub-circuits or even devices, made up of several electrical and/or electronic components and capable of performing particular functions, for example amplification or signal conversion stages.

Figure 4:
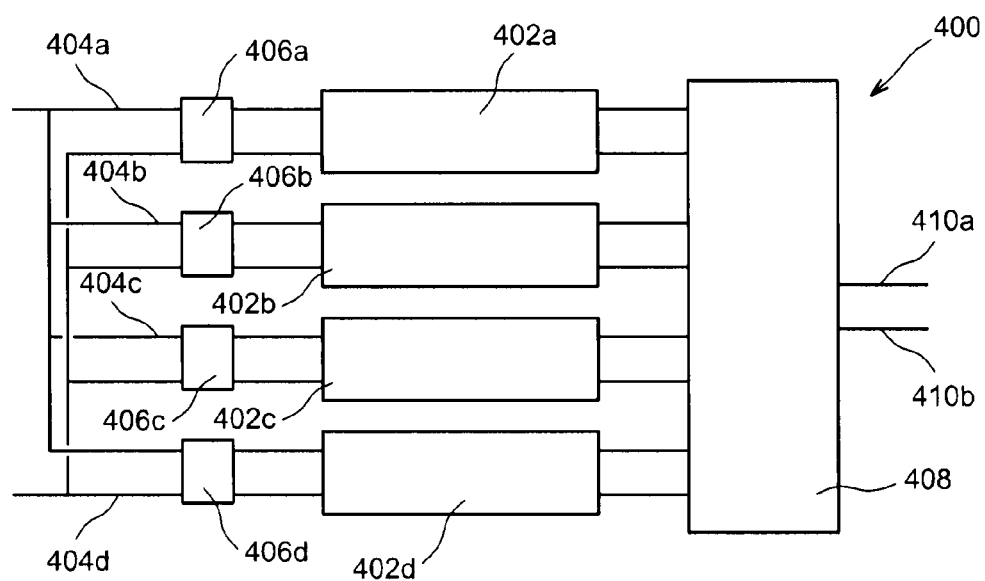

One example of such a circuit 400 is shown in FIG. 4. This circuit 400 includes four blocks 402a-402d, each performing an identical processing function, amplification for example, on the signals, voltages for example, applied to the differential inputs 404a-404d of the blocks 402a-402d. The four blocks 402a-402d therefore have the same theoretical nominal value, corresponding here to amplification gain. One and the same input voltage is applied to the differential inputs 404a-404d. The circuit 400 also includes four sets of switches 406a-406d allowing the sign of the signals applied to the inputs 404a-404d to be inverted or not. A block 408 comprises four other sets of switches allowing the sign of each of the output signals obtained from the blocks 402a-402d to be inverted or not, these signals being summed and delivered at the differential outputs 410a, 410b.

Such a circuit 400 allows, particularly when the error due to the blocks 402a-402d is additive (for example an offset the value whereof is identical whatever the sign and the value of the signal applied to the input of one of the blocks), a first inversion to be performed by one or more of the switches 406a-406d, a second inversion of these signals then being performed by means of the block 408 which allows recovery of the original sign of the signal applied to the input before performing the summation of the signals.

In the example of the circuit 400, it is desired to form an amplifier with a nominal gain equal to 4. Thus, if the blocks 402a-402d each perform an amplification with the same nominal gain equal to 1 and the offsets of the blocks 402a-402d are for example equal to 0.01 for the blocks 402a and 402c, 0.02 for the block 402b and −0.02 for the block 402d, it will be possible to perform an inversion at the switch 406c in order to obtain at the output a gain equal to:

(1+0.01)+(1+0.02)−(−1+0.01)+(1−0.02)=4

By comparison, if no sign inversion is performed, an amplifier is obtained having an offset equal to 0.02.

It is then seen that a judiciously chosen sign inversion of the input and output signals of one or more of the blocks 402a-402d makes it possible to obtain at least one configuration wherein the offset of the amplifier is eliminated.

In one variation, as for the foregoing circuits 100, 200 or 300, it is possible for the circuit 400 to include a greater number of blocks 402 and to use only part of these blocks to build the configurations of the circuit 400.

Figure 5:
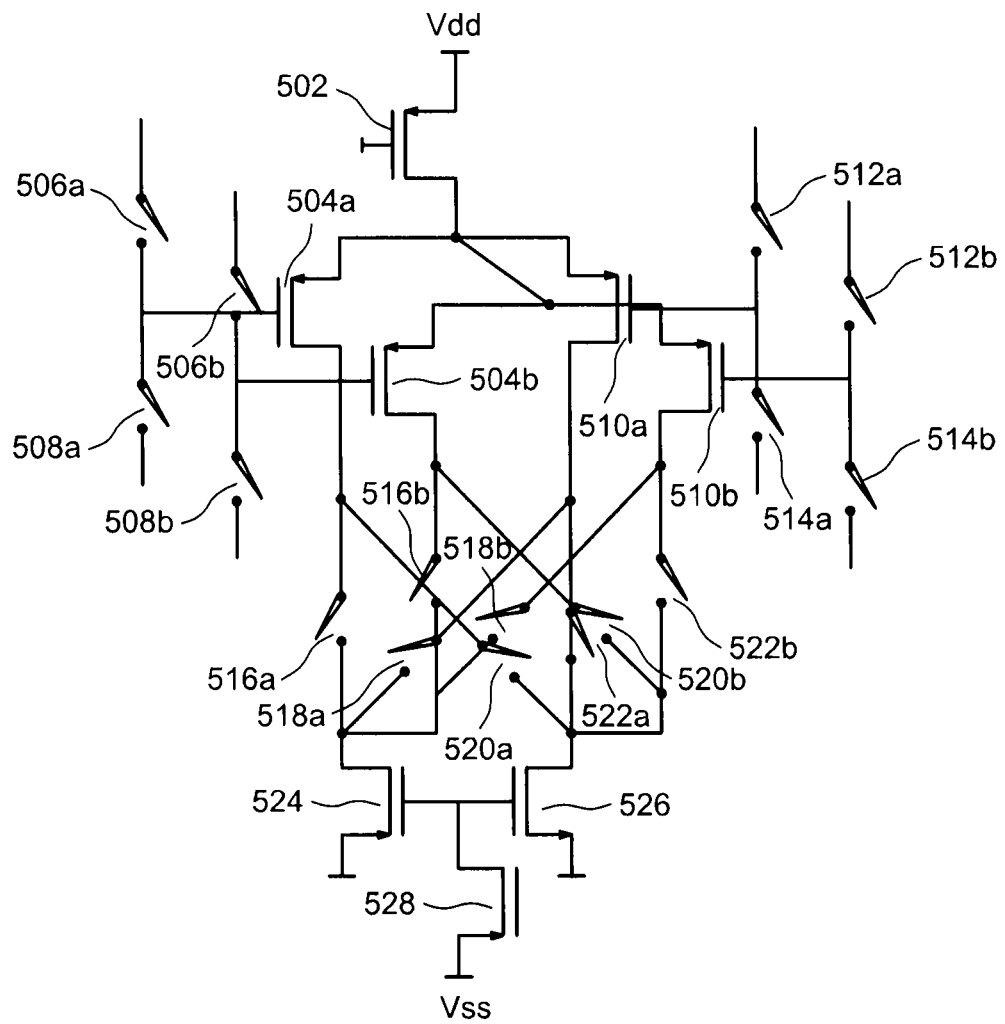

FIG. 5 shows an embodiment of one of the blocks 402a-402d of the circuit 400 previously described in connection with FIG. 4, constituting a circuit consisting of two CMOS long-tailed pairs.

This circuit includes a first MOS transistor 502, the source whereof is connected to a voltage $V_{DD}$, a control voltage Vp being applied to the gate of this first transistor 502.

The drain of the first transistor 502 is connected to the source of the two second MOS transistors 504a, 504b the gates whereof are connected to two switches, respectively referenced 506a, 506b and 508a, 508b, making it possible to connect each of these gates either to the positive component of an input signal Vin(t), corresponding to the input signal applied to the inputs of the blocks 402, or to the negative component of the input signal Vin(t).

The drain of the first transistor 502 is also connected to the source of the two third transistors 510a, 510b the gates whereof are connected to a pair of switches, respectively referenced 512a, 512b and 514a, 514b, making it possible to connect each of these gates either to the positive component of the input signal Vin(t), or to the negative component of the input signal Vin(t).

The circuit also comprises four switches 516a, 516b, 518a, 518b making it possible to connect one of the drains of the transistors 504a, 504b, 510a, 510b to the drain of a fourth transistor 524. The block also includes four switches 520a, 520b, 522a, 522b making it possible to connect one of the drains of the transistors 504a, 504b, 510a, 510b to the drain of a fifth transistor 526. Finally, a sixth transistor 528 is arranged between the gates of the transistors 524, 526 and a voltage $V_{SS}$. The output voltage of this block is obtained differentially at the drains of the transistors 524 and 526.

In this circuit, the different switches will be switched in such a way that two of the transistors 504a, 504b, 510a, 510b form a CMOS long-tailed pair coupled to the transistors 524 and 526. Thus, a first functional block can correspond to the fourth transistor 524 coupled to one of the transistors 504a, 504b, 510a, 510b which will be designed to receive as input the positive component of the input signal Vin(t), and a second functional block can correspond to the fifth transistor 526 coupled to one of the transistors 504a, 504b, 510a, 510b which will be designed to receive as input the negative component of the input signal Vin(t). The switches allow different configurations to be obtained wherein two of the four transistors 504a, 504b, 510a, 510b are coupled to the transistors 524 and 526 to form the amplification circuit with a nominal gain equal to 1. Among these different configurations, the one wherein the two functional blocks have properties closest to one another will be selected. In the present case, these properties whereof it is desired to minimize the mismatch correspond to the pairs (Vt, gm) of the transistors of these functional blocks, because the minimization of the mismatch between these characteristics of the two blocks allows a reduction of the offset obtained at the output of this circuit.

In one variation, the switches 516a, 516b, 518a, 518b, 520a, 520b, 522a, 522b could be replaced by transistors used as cascode transistors connected to the current source consisting of the transistors 524 and 526, which would allow a reduction of the number of switches in this circuit and their impact on the electrical characteristics of the operational amplifiers built.

Figure 6:
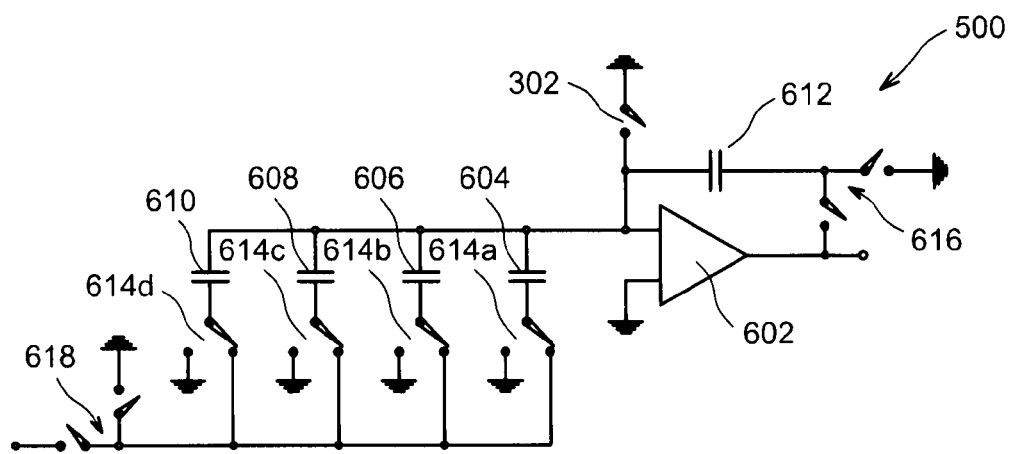

Refer now to FIG. 6 which shows a charge redistribution digital-to-analog converter 500 including an operational amplifier 602 as well as five capacitances 604, 606, 608, 610 and 612 respectively with values equal to C, 2 C, 4 C, 8 C and 16 C. These five capacitances represent the functional blocks of the circuit to be configured.

Each of the capacitances 604, 606, 608 and 610 is connected to a switch 614a-614d which makes it possible to connect, or not to connect the capacitance which is associated with it to the negative input of the operational amplifier 602.

These five capacitances 604 through 612 are obtained from at least 31 capacitances, consisting for example of 31 capacitors, not shown, with the same identical nominal values equal to 1 C, connected together in parallel, and which will be distributed optimally into five functional blocks using switches, also not shown, to constitute the five capacitances 604 through 612. In one variation, it is also possible to build these capacitances 604 through 612 from capacitances with identical nominal values different from 1 C, for example 62 capacitances each with a nominal value equal to 0.5 C. The 31 capacitors can therefore pass from one functional block to the other according to the different connection configurations contemplated.

Figure 7:
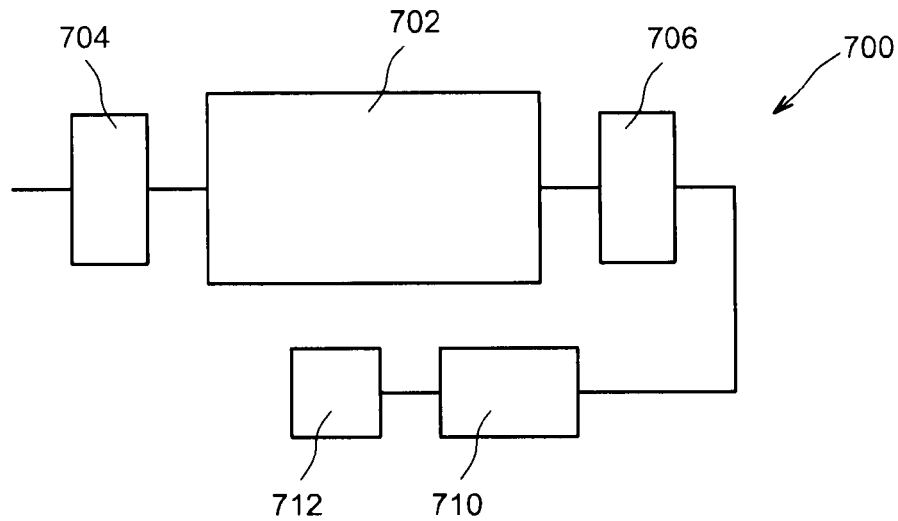
FIG. 7 shows an electrical circuit configuration device according to a particular embodiment.

Refer now to FIG. 7 in which is shown an electrical circuit configuration device 700 according to one particular embodiment, allowing the implementation of a circuit configuration method as described previously in connection with the circuits 100 through 500.

The device 700 includes an electrical circuit 702 to be configured. The circuit 702 includes for example one of the circuits 100 through 500 described previously, and includes in particular a set of electrical elements of similar type and means for connecting said electrical elements to one another and/or to the rest of the circuit. These connecting means make it possible to connect the electrical elements according to different connection configurations constituting, within the circuit 702, several functional blocks having characteristic quantities of the same type and the values whereof are mutually proportional.

The device 700 also includes means 704 allowing one or more signals to be applied to the input of the circuit 702, as well as measurement means 706 allowing measurement of a value of at least one parameter of the electrical circuit 702 for each of the connection configurations tested. The characteristics of the signal(s) applied to the input of the circuit 702 will be selected depending on the nature of the circuit 702, this signal being for example a ramp, a step function, a sinusoid, etc. The measurement means 706 can measure the electrical signals obtained at the output of the circuit 702, but also the characteristics peculiar to the circuit 702, for example the electrical resistances of the functional blocks if the circuit 702 is similar to the circuits 100 and 200 described previously.

Means 710 then allow the selection, among the different configuration, of the one for which the value of the measured parameter corresponds to the case where the mismatch between the values of the characteristic quantities of at least one pair of functional blocks is the smallest.

Based on the selection performed by the means 710, positioning means 712 allow the connecting means, switches for example, of the electrical elements of the circuit 702 to be switched so that these electrical elements are interconnected according to the chosen configuration.

The invention claimed is:

1. A method for configuring an electrical circuit comprising several functional blocks each having an output characteristic, the electrical circuit having a performance parameter which is dependent on the output characteristics of the functional blocks being mutually proportional in value, the method comprising:
    providing a set of electrical elements each having the same theoretical nominal value but different true values;
    providing a plurality of connecting elements configured to connect said set of electrical elements to at least one of: one another and the rest of the electrical circuit according to a plurality of different connection configurations to be tested;
    connecting said set of electrical elements into each of said plurality of different connection configurations to form at least a pair of said functional blocks such that for each configuration at least part of the electrical elements in said set of electrical elements are distributed between said pair of functional blocks;
    measuring said performance parameter of the electrical circuit for each of said plurality of different connection configurations;
    determining, based on said performance parameter, a mismatch between the output characteristics of the pair of functional blocks for each of the plurality of connection configurations, each mismatch caused by said different true values;
    identifying a smallest mismatch between said output characteristics of the pair of functional blocks among the plurality of connection configurations; and
    positioning the connecting elements to form a connection configuration of the set of electrical elements which provides the pair of functional blocks having smallest mismatch.

2. The method according to claim 1, wherein the performance parameter of the electrical circuit is a signal-to-noise ratio, or a linearity level, or an offset level of the electrical circuit.

3. The method according to claim 1, wherein the performance parameter of the electrical circuit is the mismatch between the values of the output characteristics of said pair of functional blocks.

4. The method according to claim 1, wherein the electrical elements are electrical components corresponding to resistors and/or inductors and/or capacitors and/or transistors, or electrical devices each including a plurality of electrical components.

5. The method according to claim 1, wherein the electrical circuit includes at least one analog-to-digital converter and/or one digital-to-analog converter and/or one comparator and/or one amplifier and/or one switched-capacitor filter.

6. The method according to claim 1, wherein at least part of the connection configurations are obtained by inverting the sign of at least one input and/or output signal of at least one of the electrical elements.

7. The method according to claim 1, wherein the connecting comprises interconnecting, in series and/or in parallel, the electrical elements that make up one and the same functional block for each pair of functional blocks.

8. The method according to claim 1, wherein, for each connection configuration, said set of electrical elements is selected from among a plurality of electrical elements.

9. The method according to claim 1, wherein the measurement of the performance parameter of the electrical circuit is performed by applying a known signal to the input of the functional blocks constituted for each of the configurations and measuring the output characteristic of each of said functional blocks.

* * * * *